United States Patent [19]

Lindmayer

[11] 4,330,582

[45] May 18, 1982

[54] SEMICRYSTALLINE SILICON PRODUCTS

[75] Inventor: Joseph Lindmayer, Bethesda, Md.

[73] Assignee: Semix Incorporated, Gaithersburg, Md.

[21] Appl. No.: 131,820

[22] Filed: Mar. 19, 1980

Related U.S. Application Data

[60] Division of Ser. No. 959,982, Nov. 13, 1978, Pat. No. 4,256,681, which is a continuation of Ser. No. 751,342, Dec. 16, 1976, abandoned.

[51] Int. Cl.$^3$ ............................................. C01B 33/00
[52] U.S. Cl. ..................................... 428/64; 423/348; 428/446
[58] Field of Search .................... 428/446, 64; 357/60, 357/61, 63, 59; 136/258; 264/332, 326, 65, 244, 85; 423/348

[56] References Cited

U.S. PATENT DOCUMENTS

| | | | |
|---|---|---|---|
| 3,624,467 | 11/1971 | Bean et al. | 357/60 |
| 3,953,876 | 4/1976 | Sirtt et al. | 357/60 |
| 3,995,309 | 11/1976 | Torreau, Jr. | 357/60 |
| 4,077,818 | 3/1978 | Chu | 136/258 |
| 4,124,410 | 11/1978 | Kotral et al. | 136/258 |
| 4,194,212 | 3/1980 | Lindmayer | 136/258 |
| 4,249,457 | 2/1981 | Lovelace et al. | 357/63 |

FOREIGN PATENT DOCUMENTS 590458  8/1947  United Kingdom .

OTHER PUBLICATIONS

Lindmayer, New Developments in Silicon Solar Cells, Proceedings Int'l. Photovoltaic Solar Energy Conference, 1978.

*Primary Examiner*—Stanley S. Silverman
*Attorney, Agent, or Firm*—Watson, Cole, Grindle & Watson

[57] ABSTRACT

A method of producing semicrystalline silicon by heating the silicon to a molten state and gradually cooling the silicon to mitigate disruptions in the silicon continuum and promote semicrystalline growth. The product formed is a silicon body, which may be sliced into wafers having highly ordered grains of a mean diameter of at least about one mm.

6 Claims, No Drawings

SEMICRYSTALLINE SILICON PRODUCTS

This is a division of application Ser. No. 959,982 filed Nov. 13, 1978, now U.S. Pat. No. 4,256,681, which is a continuation application of Ser. No. 751,342, filed Dec. 16, 1976, now abandoned.

The present invention generally relates to a method of producing a silicon product suitable for use in certain semiconductor devices. More specifically, it refers to such a method wherein the product so formed is of a grainy structure and is suitable for use, e.g., in making silicon solar energy cells, although it is not in the form of the single crystal silicon normally used for such purpose.

Historically, solar cells have employed a so-called single crystal or semiconductor grade silicon for use in producing silicon solar energy cells. Yet the cost of such crystalline silicon in ingot form is presently about $300/kg, the overwhelming portion of which cost is due to the expense of forming the crystalline structure of the silicon. Typically, single crystal silicon is produced by either the Czochralski (CZ) or Float Zone (FZ) methods. By the CZ method molten silicon is seeded and then the seeded silicon is extended by a crystal pulling machine. In the FZ process, zones of a silicon ingot are melted by passing the ingot back and forth through a localized heater. Because of the difficult and expensive methods of creating single crystal silicon, the cost is very high, and this causes silicon solar cells to be expensive.

The present invention, on the contrary, is based on the discovery that single crystal silicon is not necessary for making solar cells; quite satisfactory efficiencies may be obtained with silicon of a high degree of crystallographic order in the form of relatively large grains or crystallites.

By utilizing the ability of silicon to self-seed, i.e., to form crystal centers and then relatively large crystallites, the proper conditions can be provided to encourage such growth and, thereafter, the utilization of the product to form solar cells.

At a workshop conference conducted at Cherry Hill, N. J. on Oct. 23 to 25, 1973, which conference was sponsored by the National Science Foundation, a workshop was devoted to the subject of polycrystalline silicon. An executive report on the workshop conference is dated Oct. 15, 1974. The chairman of the polycrystalline silicon workshop was Dr. T. L. Chu, of Southern Methodist University. At that workshop, as reported in Volume 1 of the Proceedings thereof, the major problems of utilizing polycrystalline silicon were outlined. At that time it was recognized that technological breakthroughs would be necessary in order to overcome the known, low efficiencies of solar energy cells formed from polycrystalline silicon. As an objective, the first goal set forth in the proceedings of the workshop, of which applicant was a member, was to produce a polycrystalline silicon solar cell with a 5% efficiency. It was an objective to produce such a photovoltaic cell in five years, i.e., by 1978, and a 10% efficient cell by 1983. The 10% efficient cell objective now has been accomplished and the method for obtaining a silicon for that cell is embodied in the present invention.

The present invention is founded on a discovery that casting silicon, regardless of the original, crystallographic structure thereof, can result in silicon of much more desirable crystallographic structure and product what applicant believes most properly is termed, semicrystalline silicon. While, as evidenced by the title of the NSF Polycrystalline Silicon Workshop in 1973, silicon that is crystalline and in a form other than single crystal has been termed, polycrystalline, it is believed that the term, semicrystalline, is more appropriate to describe silicon in which the grain size is in the order of millimeters. According to applicant's work in this field, it is not simply the number of crystal centers that are formed in a crystalline silicon material that controls the suitability of the silicon for use in making photovoltaic cells. It is, inter alia, the presence of highly ordered crystalline silicon, regardless of the fact that the crystalline silicon may be enclosed or separated by regions of less well ordered crystalline silicon. Stated otherwise, semicrystalline silicon is that where a high degree of order exists within the grain and defects can be assigned to the grain boundaries.

By the practice of the present method, it has been found possible to produce an ingot and wafers that have a plurality of crystal centers; however, the silicon so produced has crystal grains of a size sufficient to have most defects concentrated at the grain boundaries. Other than at grain boundaries, the grains are highly ordered so far as crystallographic structure is concerned.

In its most basic form the present inventive method comprises heating silicon to a temperature at which it is in a freely molten state, i.e., at a temperature in excess of about 1410° C., the melting point of silicon, and then gradually cooling the silicon. Such cooling is not rapid. It is particularly deliberate at the solidification point of silicon. After the critical temperature region of about 1410° C. has been passed, the silicon is further cooled to ambient temperatures.

Such gradual cooling at the solidification point of the silicon has been found to accomplish two purposes: it maintains the continuum of the silicon, i.e., it mitigates the formation of air bubbles and other imperfections and disruptions to the resulting, solid silicon. Further, it encourages the formation of silicon of a relatively large grain size, regardless of the original state of the silicon. When the cooling has been carried out in a gradual manner, preferably over a period of at least 10 to 15 minutes as the temperature of the silicon passes through the region of the solidification point of the silicon, holes or pockets formed by air trapped in the ingots are substantially eliminated. Moreover, comparatively large crystallites are formed. Consequently, the product of the present process is first an ingot or cast body of silicon and then, after slicing, a silicon wafer that will be relatively free of holes and will have at least one surface composed of comparatively large crystallites or grains.

Upon analysis, these grains are found to contain crystallites of silicon the interiors of which are highly ordered with respect to the crystallographic structure of the silicon. By this it is meant that the crystalline silicon near the central region of each grain is quite similar to single crystal silicon in structure. At peripheral portions of the individual grains, however, which peripheral portions are referred to herein as grain boundaries, there is a relatively high concentration of defects in crystal structure. The grain boundaries, it is found, are composed of what might be termed poorly ordered silicon in combination with impurities. Consequently, while the highly ordered silicon within the silicon grains was quite suitable for use in photovoltaic cells, it was found that silicon at the grain boundaries, which silicon is relatively disordered, is not nearly as suitable for that use.

Since it is at the grain boundaries that impurities are concentrated, and at which the crystallographic state of the silicon is relatively disordered, it has become apparent that there is a definite relationship of grain size to solar cell efficiency. For a background of the so-called diamond structure of silicon crystals, see *Fundamentals of Semiconductor Devices*, by Joseph Lindmayer and Charles Y. Wrigley, D. Van Nostrand and Co., Inc., Princeton, N. J. (1965), Chapter 6. In general, the efficiency of a silicon device for converting solar energy into electricity varies in accordance with the grain or crystallite size, i.e., the larger the grain, the greater the solar cell efficiency. Over certain ranges of grain size, those quantities may vary directly and in a straight-line ratio.

Regarding multiple grains of silicon as manifestations of high densities of defect states of the silicon as compared to single crystals, it has been possible to calculate solar conversion efficiencies as a function of crystal defect density. Such a plot reveals that in order for the semicrystalline silicon produced by practicing the present process to have utility in forming silicon wafers for use as photovoltaic devices, the size of the grains of silicon, at least at the surface of the silicon wafer and preferably throughout the entirety of the wafer and ingot, should be at least about one mm., in mean diameter. Naturally, since the silicon crystallites or grains are not perfect spheres, many will have no true diameters. Consequently, by use of the term, diameter, is meant the longest straight line that can be drawn through the center of the grain and terminated at opposed surfaces of the grain. With mean diameters of at least about one mm., it has been found that there will be a sufficient quantity of highly ordered crystallographic silicon within the grains to provide photovoltaic results approaching that of single crystal silicon despite the presence of the less ordered silicon and impurities at the grain boundaries. Naturally, further refinements will be developed for maximizing the sizes of the grains while casting the silicon.

In a preferred embodiment of my invention, I begin the casting procedure utilizing refined silicon, which is commonly referred to as "poly". This poly has silicon crystallites of a mean diameter of about eight microns. The poly was utilized, although metallurgical grade silicon, which contains more impurities, could have been used. However, if such metallurgical grade silicon is utilized, impurities therein should preferably be removed in accordance with the process set forth in my application Ser. No. 751,343, entitled Method Of Purifying Silicon, filed concurrently herewith, and now abandoned in favor of application Ser. No. 112,213, filed Jan. 15, 1980. In any case, the refined silicon was placed in a graphite crucible and some elemental boron added so that the resulting silicon, after casting, will be of the p-type. The crucible was placed in a quartz tube surrounded by radio frequency heating coils. The crucible and the coils were of necessity, enclosed within a heating chamber the controls to which, for purposes of safety, were operable from outside the chamber.

Through suitable connections a flow of gas comprising a mixture of hydrogen and argon in an approximately equal proportion, was initiated through the tube and about and past the crucible. At the same time the rf generator was activated and the power increased until the silicon in the chamber was in a molten, i.e., liquid state. By the use of an optical pyrometer, the temperature of the molten silicon was adjudged to be about 1450° C.

After the molten silicon had been maintained in that state subjected to inert gas flow, the temperature of the molten silicon was allowed to cool slowly. During cooling, the radio frequency heater was maintained in operation but at a lesser rate of heating than had previously been used to melt the silicon. After about eight minutes, the temperature of the molten silicon had decreased from about 1430° C. to approximately 1412° C., when it was apparent that silicon crystals were beginning to form. At that time the setting of the radio frequency heater was increased slightly. Ten minutes later the temperature of the molten silicon had decreased to 1410° C. The setting of the radio frequency heater was again increased slightly and after a further five minutes the temperature of the silicon in the crucible was approximately 1409° C. The setting of the radio frequency heater was then lowered substantially, and after an additional twenty minutes, the temperature within the chamber and the temperature of the silicon, which had now solidified, was approximately 1250° C. Thereafter all radio frequency heat was removed and the flow of gas stopped. After an hour or so, the crucible and the solidified silicon were at ambient temperature.

After the solidified silicon was removed from the graphite crucible, it was substantially in the form of an ingot, which externally appeared free of punctures. The ingot was sliced into wafers. The wafers of silicon so sliced were substantially free of holes, although there were some very small holes in some slices. Examination under a microscope showed that the surface of a slice was composed of crystallites of silicon with a mean diameter of about two mm. The crystallites varied in size from about one mm. to about three or four mm. in diameter, and at the surface of the slice were in approximately the same plane, although there were slight variations in outward extension between crystallites at the surface of a slice. Upon further examination, it was observed that the grains or crystallites of silicon extended completely through the slices and that both surfaces of the sliced silicon exhibited substantially the same structure. The grains appeared to be randomly arranged, i.e., there was no fixed pattern to the grain boundaries, and no grain boundaries ran perpendicularly from one surface of the wafer to the other in a straight line. Instead, the grain boundaries followed a sinuous path from one surface to another, such path being determined by the random arrangement of the silicon crystallites or grains.

As will be more fully described in another application on which I am the applicant and is to be filed shortly, now application Ser. No. 968,039, filed Dec. 11, 1978, the slice so developed was etched, and an impurity of opposite sign to the dopant incorporated in the cast silicon was diffused into the slice. After aluminum had been evaporated onto the back of the wafer to establish a back contact, and a front pattern of grids has been applied, the cell was tested for efficiency using a light source equivalent of one full sun. The efficiency of the cell so tested was approximately ten percent. The fact that a silicon photovoltaic cell having a 10% efficiency could be made confirms that it is possible to manufacture silicon solar energy cells from an initially polycrystalline silicon, for example, refined or metallurgical grade silicon.

As described in my preferred embodiment, the container for the silicon is inert, i.e., there is substantially no reaction between the container and the silicon. Likewise, the gases passed over and around surface of the molten silicon are inert with respect to the silicon and the container, and the atmosphere is non-oxidizing. They are, however, not necessarily inert with respect to impurities in the silicon.

The feature that is considered to be necessary to my above-described process is that a sufficient grain size of silicon crystallites be produced. Such grain size is obtained by gradual cooling of molten silicon, specifically at the region of the solidification or crystallization point of the silicon. While there is generally a direct ratio between the grain size and efficiency, it is believed that grains of silicon having a mean diameter of at least approximately one mm. are required to make the casting process feasible. Much smaller grain sizes, for example, grains having a mean diameter of eight microns, were found to yield silicon wafers having an efficiency of about one-half percent. These latter wafers were most certainly unsuitable for use in photovoltaic cells.

It will be apparent that some modifications and alterations in my inventive method and products as described hereinbefore will be obvious to those of skill in this art. As to such obvious modifications and alterations, it is desired that they be deemed to fall within the scope of my invention, which is to be limited only by the recitations, and equivalents thereof, of the following, appended claims.

I claim:

1. A semicrystalline silicon wafer composed of randomly arranged silicon grains, such grains at least at one surface of the wafer having a mean diameter of at least about one mm. and abutting each other at the boundaries of the grains, said grains at their interiors being composed of silicon of relatively high crystallographic order when compared with the silicon at the grain boundaries, said grains being distributed in substantially non-columnar, non-linear fashion in said wafer.

2. A semicrystalline silicon wafer as claimed in claim 1, in which said grains at said one surface have a mean diameter of about 1 to 10 mm.

3. A semicrystalline silicon wafer as claimed in calim 1, in which said wafer has incorporated throughout its mass a dopant of a single conductivity type.

4. A silicon ingot composed of randomly arranged grains of semicrystalline silicon, said grains having a mean diameter of at least about one mm. and abutting each other at the boundaries of the grains, said grains at their interiors being composed of silicon of relatively high crystallographic order when compared with the silicon at the grain boundaries, said grains being distributed in substantially non-columnar, non-linear fashion in said ingot.

5. A silicon ingot as claimed in claim 4, in which substantially all of the grains of silicon at central portions of the ingot have a diameter of between about 1 and 10 mm.

6. A silicon ingot as claimed in claim 4, in which said ingot has incorporated throughout its mass a dopant of a single conductivity type.

* * * * *